United States Patent [19]
Yamamoto et al.

[11] Patent Number: 5,785,754
[45] Date of Patent: Jul. 28, 1998

[54] SUBSTRATE, SEMICONDUCTOR DEVICE, ELEMENT-MOUNTED DEVICE AND PREPARATION OF SUBSTRATE

[75] Inventors: Yoshiyuki Yamamoto; Keiichiro Tanabe; Katsuko Harano; Nobuhiro Ota; Naoji Fujimori, all of Itami, Japan

[73] Assignee: Sumitomo Electric Industries, Ltd., Osaka, Japan

[21] Appl. No.: 565,593

[22] Filed: Nov. 30, 1995

[30] Foreign Application Priority Data

| Nov. 30, 1994 | [JP] | Japan | 6-296351 |
| Nov. 30, 1994 | [JP] | Japan | 6-296353 |
| Dec. 22, 1994 | [JP] | Japan | 6-319964 |
| Dec. 22, 1994 | [JP] | Japan | 6-319969 |
| Dec. 22, 1994 | [JP] | Japan | 6-319975 |
| Dec. 22, 1994 | [JP] | Japan | 6-319978 |
| Dec. 22, 1994 | [JP] | Japan | 6-319982 |

[51] Int. Cl.$^6$ .............................................. C30B 29/05
[52] U.S. Cl. ............................ 117/89; 117/94; 117/95; 117/929
[58] Field of Search .................... 117/89, 94, 95, 117/929

[56] References Cited

FOREIGN PATENT DOCUMENTS

| 0 521 405 | 1/1993 | European Pat. Off. . |
| 1-104761 | 4/1989 | Japan . |
| 1-123423 | 5/1989 | Japan . |
| 4-273466 | 9/1992 | Japan . |

OTHER PUBLICATIONS

Ramsham et al, "Fabrication of Microchannels in Synthetic Polycrystalline Diamond Thin Films for Heat Sinking Applications", Journal of the Electrochemical Society, vol. 138, No. 6, Jun. 1991, pp. 1706–1709.

Fiegl et al., "Diamond Films as Thermal Conductors and Electrical Insulators Applied to Semiconductor Power Modules", Diamond and Related Materials, vol. 3, Nos. 4/6, Apr. 1994, pp. 658–662.

*Primary Examiner*—Robert Kunemund
*Attorney, Agent, or Firm*—Pillsbury Madison & Sutro LLP Intellectual Property Group

[57] ABSTRACT

A substrate, which has a high thermal conductivity material layer having a thermal conductivity of at least 10 W/cm·K and which has a cooling medium flow path on or in the high thermal conductivity material layer, has a high heat-dissipating property.

56 Claims, 8 Drawing Sheets

1

SUBSTRATE, SEMICONDUCTOR DEVICE, ELEMENT-MOUNTED DEVICE AND PREPARATION OF SUBSTRATE

FIELD OF THE INVENTION

The present invention relates to a substrate, particularly a heat-dissipating substrate, a semiconductor device and element-mounted device comprising the substrate and a method of preparing the substrate. The substrate of the present invention is suitable for mounting and cooling an element having a large heating density such as a semiconductor element, for example, an ultra high speed MPU and a large output semiconductor laser. The element may require a strict temperature control and may be mounted at a high density.

RELATED ART

A semiconductor laser used in a submarine cable and the like increasingly has a large output for performance of a long distance transmission and has a rapidly increased exothermal amount. With the compaction and higher processing speed of an information processing system and the like, a processability per a unit area of the semiconductor element contained in an apparatus is rapidly increased. This introduces an increase of an evolved heat per unit area in the semiconductor device. The importance of keeping the heat-dissipating property draws attention at the design of the substrate. The above element requires to have a strict control of the operation temperature and the change of the element temperature causes, for example, the shift of a generated wave length.

The material such as alumina, which is mainly used for the package, has the problem of heat dissipation when the above high performance element is mounted. A presently used package has a high inherent thermal resistance and cannot sufficiently dissipate the heat from the element itself so that the element has an elevated temperature and erroneously operates or runs away. To solve the above problems, it is effective to use a material having a higher thermal conductivity. Diamond having the highest thermal conductivity among all materials is used for a semiconductor laser diode and the like.

The heat transported by the heat-dissipating substrate should be finally exhausted by transmitting the heat to external air or cooling water. When the heat evolved by the mounted semiconductor element is large, a material having high thermal conductivity must be used and it is important to effectively dissipating from the substrate a large amount of the heat transmitted from the high thermal conductivity material. For this purpose, it is proposed to increase a heat-dissipating area and a heat-dissipating efficiency by attaching the fins or the cooling pipe to the back side of the substrate. When the cooling pipe is attached to the substrate, it is impossible to prevent the addition of a surplus thermal resistance at the attached part. The fins have the lower cooling efficiency than the cooling pipe. The development of the substrate having the high heat dissipation property which can give an efficient cooling property is required.

The improvement of a processing speed of a semiconductor element, particularly LSI and the development of a mount technique of a portable information processing machine are astonished. Because of the improvement of the processing speed of the LSI, a signal delay caused by the wiring between the chips cannot be neglected. In addition, the needs for the portable information processing machine give a rapid increase of the mount density of the LSI.

The mounted substrate satisfying the above requirements must require two contradictory requirements, one being to increase the substantial mount density of each semiconductor element and the other being to remove efficiently the evolved heat. A high density mount technique such as a MCM (Multi Chip Module) substrate is developed to be used mainly for a CPU of a super computer.

As to the MCM substrate, an AlN plate is used for a substrate required to have the highest heat-dissipating property. However, AlN has a heat conductivity of only about 2 W/cm·K. It is difficult to use AlN for mounting the elements having a higher evolved heat density at a higher mount density and elements.

Japanese Patent Kokai Publication No. 273466/1992 discloses that a coolant is passed through a structure by preparing a hole at a side surface in a three-dimensional integrated circuit substrate comprising diamond. However, this structure has a poor efficiency, since the part including a flow path is apart from a center part of the substrate (a part which is supposed to have a highest temperature increase).

SUMMARY OF THE INVENTION

The inventors of the present application intensively studied to solve the above problems and to have a substrate having a high cooling efficiency, and discovered that the formation of a flow path for directly passing a coolant through a material having a high thermal conductivity gives a substrate having a remarkably improved heat-dissipation property in comparison with a prior art substrate.

The present invention provides a substrate (for example, a heat-dissipating substrate) comprising a layer of a high thermal conductivity material having a thermal conductivity of at least 10 W/cm·K and positioned on a base material, wherein a flow path for passing a cooling medium (or refrigerant) is provided on the high thermal conductivity material layer adjacent an interface between the base material and the high thermal conductivity material layer.

The present invention provides an element-mounted device comprising a layer of a high thermal conductivity material having a thermal conductivity of at least 10 W/cm·K and positioned on a base material wherein a flow path for passing a cooling medium is provided on the high thermal conductivity material layer adjacent an interface between the base material and the high thermal conductivity material layer, and at least one heating element having a maximum heat density of at least 1 W/cm² is mounted on the high thermal conductivity material layer. The element-mounted device comprises the substrate formed from the base material and the high thermal conductivity material layer, and the element mounted on the substrate.

In addition, the present invention provides a substrate (for example, a heat-dissipating substrate) comprising at least one flow path for passing a cooling medium which is embedded in a plate made of a high thermal conductivity material having a thermal conductivity of at least 10 W/cm·K.

Further, the present invention provides an element-mounted device wherein at least one flow path for passing a cooling medium is embedded in a substrate made of a high thermal conductivity material having a thermal conductivity of at least 10 W/cm·K, and at least one heating element having a maximum heat density of at least 1 w/cm² is mounted on the substrate.

Further, the present invention provides a semiconductor device having at least two piled substrates, wherein at least one flow path is embedded in each substrate made of a high thermal conductivity material having a thermal conductivity of at least 10 W/cm·K, at least one element is mounted on each substrate, and a metal wiring for connecting between the elements is positioned on or in the substrate.

The present invention provides a method of preparing a substrate which comprises steps of a) conducting a laser light treatment on one main surface of a plate comprising a high thermal conductivity material having a thermal conductivity of at least 10 W/cm·K to form a flow path for passing a cooling medium on said surface, and b) adhering said treated surface to a base material.

The present invention provides a method of preparing a substrate which comprises steps of a) conducting a laser light treatment on one main surface of a plate comprising a high thermal conductivity material having a thermal conductivity of at least 10 W/cm·K to form a flow path for passing a cooling medium on said surface, and b) adhering said treated surface to another plate comprising a high thermal conductivity material having a thermal conductivity of at least 10 W/cm·K.

The present invention provides a method of preparing a substrate which comprising step of conducting a laser light treatment on a side surface of a plate comprising a high thermal conductivity material having a thermal conductivity of at least 10 W/cm·K to form a flow path for passing a cooling medium.

The present invention provides a method of preparing a substrate which comprises steps of a) providing a mask partially on one main surface of a plate comprising a high thermal conductivity material having a thermal conductivity of at least 10 W/cm·K, b) selectively etching a portion having no mask to form a flow path for passing a cooling medium, c) removing the mask, and d) adhering the etched surface to a base material.

The present invention provides a method of preparing a substrate which comprises steps of a) forming a groove on a plate material, b) growing diamond by a vapor phase deposition on the plate material, c) removing the plate material to give a grooved self-standing diamond film, and d) adhering the grooved surface of the diamond film to a base material.

The present invention provides a method of preparing a substrate which comprises steps of a) providing a mask on a base material, b) growing diamond by a vapor phase deposition on the base material, and c) removing the mask to give a flow path for passage of a cooling medium.

The present invention provides a method of preparing a substrate which comprises steps of a) providing a mask on a plate material, b) growing diamond by a vapor phase deposition on the plate material, c) removing the mask and the plate material to give a grooved self-standing diamond film, and d) adhering the grooved surface of the diamond film to a base material.

DETAILED DESCRIPTION OF THE INVENTION

Figure 1:
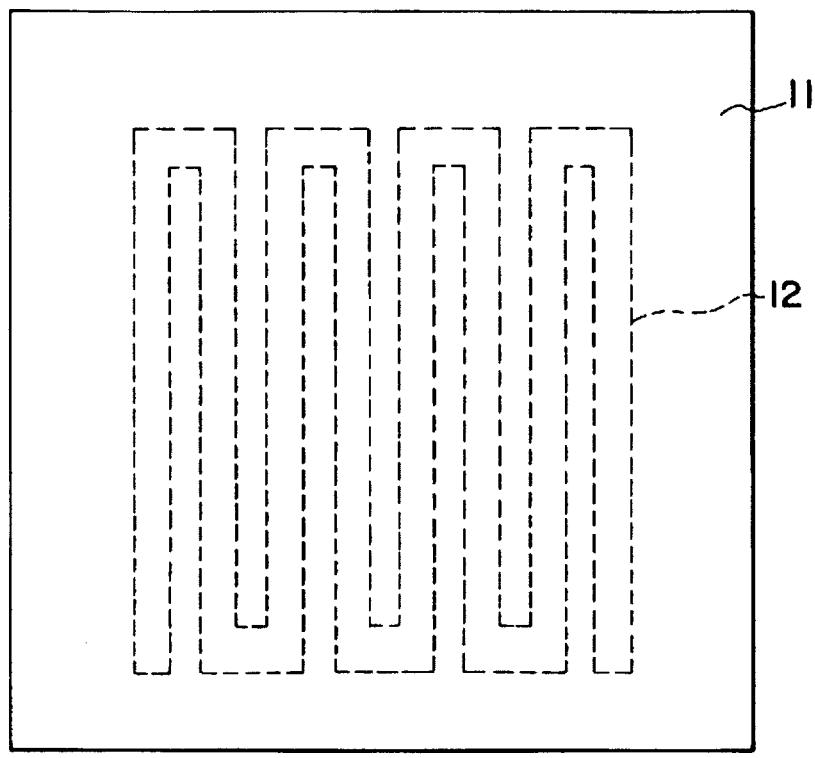
FIG. 1 is a schematic plane view of a grooved high thermal conductivity material layer according to the present invention.

The present invention will be explained in detail.

In one embodiment of the substrate of the present invention, the high thermal conductivity material layer is laminated on the base material, and the groove (namely, a flow path or a channel) for passing the cooling medium (or refrigerant) is formed in high thermal conductivity material layer at the interface between the high thermal conductivity material layer and the base material. The heat evolved from the heating element such as a semiconductor element positioned on the high thermal conductivity material layer is transmitted into the high thermal conductivity material layer at a small temperature gradient and removed by the cooling medium passing through the groove formed on the high thermal conductivity material back surface.

The high thermal conductivity material layer preferably has a higher thermal conductivity, since the element temperature can be significantly decreased. The thermal conductivity is preferably as large as possible, and is suitably at least 10 W/cm·K. Specific examples of the high thermal conductivity material are natural diamond, synthetic diamond by a high pressure and high temperature method and chemical vapor deposited (CVD) diamond. These are suitable for the high thermal conductivity material layer. When diamond prepared by the chemical vapor deposition, the high thermal conductivity material layer having a relatively large area can be obtained at a cheap price. The thermal conductivity generally depends on the temperature. The thermal conductivity of diamond decreases, as the temperature increases in the range above the room temperature. In the case of the substrate mounting a usual element (for example, an electronic element such as semiconductor element), the temperature of the mounted element is at most between 100° C. and 200° C., and the high thermal conductivity material layer preferably has the thermal conductivity of at least 10 W/cm·K in this temperature range. The thickness of the high thermal conductivity material layer is preferably at least 30 µm, more preferably at least 70 µm. The upper limit of the thickness of the high thermal conductivity material layer is usually 10 mm, for example 5 mm. The high thermal conductivity material layer may be semiconductive or conductive, and is preferably insulative. The resistivity of the high thermal conductivity material is preferably at least $1\times10^8$ Ω·cm, more preferably at least $1\times10^9$ Ω·cm.

The flow path typically has a rectangular cross-sectional shape. The depth of the groove present in the high thermal conductivity material is preferably larger due to the increase of the heat exchange efficiency, but the very large depth of the groove disadvantageously gives the poor mechanical strength. The depth (c) of the groove is preferably at least 20 µm, more preferably at least 50 µm. The depth (c) of the groove is preferably at most 90%, more preferably at most 80%, for example at most 70% of the high thermal conductivity material layer thickness. The larger width (a) of the groove gives the larger heat exchange efficiency, but the very large width gives the smaller heat exchange efficiency due to the decreased number of the grooves for maintaining the strength of the part contacting the base material. The space (b) between the grooves is in the same manner as in the width, and the very large or small space disadvantageously gives the poor results. The width (a) of the groove and the space (b) between the grooves are preferably from 20 µm to 10 mm, more preferably from 40 µm to 2 mm, most preferably from 50 µm to 2 mm. The ratio (a/b) of the width (a) to the space (b) has the lower limit of preferably 0.02, more preferably 0.04 and the upper limit of preferably 50, more preferably 25. The ratio (a/c) of the width (a) to the depth (c) has the lower limit of preferably 0.05, more preferably 0.1 and the upper limit of preferably 100, more preferably 50 (cf. FIG. 7).

The optimum width, space and depth are dependent on the element mounted on the heat-dissipating substrate. The cross-sectional shape of the groove need not be rectangular and may be a semicircular, semioval or complicated shape. In one substrate, the values of a, b and c may not be constant and can be varied in the above range. The ratio of high thermal conductivity material layer surface occupied by the groove is usually 2 to 90%, preferably 10 to 80% of the surface area of high thermal conductivity material layer. A angle (taper angle) between the side surface of the groove and the line normal to the high thermal conductivity material layer surface is preferably at most 30°.

The groove for passing the cooling medium can be suitably formed according to the position of the heating element such as the semiconductor element mounted on the substrate. The groove is preferably formed so that a part having the highest temperature caused by the mounted heating element such as the semiconductor element or a part required to have the lowest temperature is most effectively cooled. The groove is positioned so that the largest amount of the cooling medium passes through a part required to be most largely cooled. The cooling efficiency can be increased by complicating the cross-sectional shape of the groove so as to increasing the surface area of the groove. A part near an inlet for the cooling medium has a high cooling efficiency, since the cooling medium has the lowest temperature. Accordingly, when a heat distribution of the heating element is uniform, since a center part has the highest temperature, it is advantageously effective that the inlet is formed in the center part and the cooling groove is positioned in a spiral or radial shape.

The groove can be formed by processing the high thermal conductivity material layer by a laser process (for example, the use of excimer laser) or an etching process.

A layer of non-diamond carbon component (for example, graphite or noncrystalline carbon) having the thickness of 1 nm to 1 µm may be present on the surface of the groove. The non-diamond layer can be prepared by heating the high thermal conductivity material layer at 1000°–1500° C. for 30 minutes to 10 hours (for example, 1 hour) in a non-oxidation atmosphere (for example, in an inert gas atmosphere) (In this case, the non-diamond layer is also formed on the surface of the high thermal conductivity other than groove, and the non-diamond layer can be removed by a polishing process). The presence and absence of the non-diamond layer can be measured by Raman spectroscopy.

Wettability of the groove surface by the cooling medium is preferably good. A contact angle is usually at most 65°, more preferably at most 60°. Since a surface of diamond has a hydrogen atom, the surface repels the cooling medium such as water in such state. It is possible to increase the hydrophilic property of the diamond surface layer by substituting the hydrophilic group having the oxygen atom (for example, OH group) for the hydrogen atom.

In order to increase the wettability of the groove surface, the groove is annealed at 500°–800° C. for 10 minutes to the 10 hours in an oxidation atmosphere (for example, an atmospheric environment) or processed by a plasma of oxygen or a gas containing oxygen. It is supposed that the hydrophilic property is somewhat increased when an oxygen plasma is used for the formation of the groove, but the above procedure may be additionally conducted.

The process for improving the wettability of the groove surface by the cooling medium includes a plasma treatment in a gas containing nitrogen, boron or inert gas.

After the groove is formed, the high thermal conductivity material layer is adhered to the base material. The adhesion may be conducted by a metal, an adhesive or the like. The thickness of the metal or adhesive layer is usually from 0.01 to 10 µm. Alternatively, the adhesion may be conducted without a material such as the metal, and the high thermal conductivity material layer may be adhered directly to the base material.

The base material may be a material such B, Be, Al, Cu, Si, Ag, Ti, Fe, Ni, Mo, W, an alloy thereof and a compound thereof (for example, carbide or nitride).

The base material may be, for example, insulative. The base material may be a plate. The thickness of the base material is usually from 0.1 mm to 10 mm, preferably from 0.5 mm to 5 mm.

When the element is mounted on the substrate, the element is preferably positioned on the high thermal conductivity material layer.

Specific examples of the cooling medium are water, air, an inert gas (for example, nitrogen and argon), a fluorocarbon, liquid nitrogen, liquid oxygen, and liquid helium.

The element used in the present invention may be a semiconductor element, for example, a semiconductor laser, MPU (microprocessor unit) and IC. When the substrate of the present invention is used, the element is efficiently cooled so that the temperature increase of the element is prevented. If the element has the increased temperature, the wavelength of the semiconductor laser shifts to the longer wave length. However, in the present invention, the wave length never shifts to the longer wave length, since the element has no increased temperature.

Hereinafter, a method for preparing the substrate having the groove for the flow of the cooling medium at the interface between the base material and the high thermal conductivity material layer is explained.

Firstly, a method for adhering the base material to the high thermal conductivity material layer having the groove for flow of the cooling medium is illustrated. A material forming the high thermal conductivity material layer is provided in a desired size. The groove for flow of the cooling medium can be prepared by a processing method utilizing a laser light or by a selective etching.

The laser processing comprises removing the material by focusing the laser light on the material surface to form the groove on the surface. According to this process, the groove having the arbitrary positioning can be obtained. The laser light having sufficient energy density is focused on the surface of the high thermal conductivity material and the focused position is moved while removing the material to form the groove on the surface. Specific examples of the laser light are YAG laser and excimer laser. The excimer laser is preferable, since the groove having the arbitrary depth and position can be reproductively formed in view of the processing preciseness.

The wave length of the laser light is preferably at most 360 nm, for example 190 to 360 nm. The energy density of the irradiated light is usually from 10 to $10^{11}$ W/cm$^2$. A pulse laser light, which preferably has an energy density per one pulse between $10^{-1}$ J/cm$^2$ and $10^6$ J/cm$^2$ is preferable. The divergence of the laser light generated from the laser generator is preferably from $10^{-2}$ mrad to $5 \times 10^{-1}$ mrad, and a band width of the laser light is preferably from $10^{-4}$ nm to 1 nm. A uniformity of the energy distribution in the beam cross-section of the laser light is preferably at most 10%. Good process results can be obtained by focusing the pulse laser light by a cylindrical lens or a cylindrical mirror.

In such groove formation on the surface by the excimer laser, the processing in the suitable atmosphere can modify the diamond surface and can improve the wettability of the surface by the cooling medium. For example, the above processing in the atmosphere containing an amino group-containing compound (for example, ammonia or hydrazine) can give the amino group on the surface of the formed groove to increase the hydrophilic property.

The groove formation by the etching process can be conducted as follows. After a suitable mask is formed on the high thermal conductivity material layer, the treatment is conducted under the condition that the mask is not etched and only the high thermal conductivity material is etched. Then the mask is removed to give the high thermal conductivity material layer having the groove on the surface. It is known that the mask material such as Al and SiO$_2$ is formed on diamond and then diamond is selectively etched by oxygen or a gas containing oxygen to form the groove on diamond (cf. page 411 of volume 11 of Preprint of 53th meeting of the Japanese Applied Physics Society). Nitrogen or hydrogen may be used instead of oxygen or the gas containing oxygen.

The high thermal conductivity material layer having the desired groove is adhered to the separately provided base material to give the substrate having the very large heat dissipation efficiency. The base material may provisionally have an inlet and outlet for introducing (and discharging) the cooling medium into the groove formed in the high thermal conductivity material layer.

The adhesion of the high thermal conductivity material layer to the base material can be conducted by a metallization treatment or an adhesive. Two adhered surfaces may be metallized by a conventional procedure and the metal may be molten. Specific examples of the metal used in the metallization treatment are Ti, Pt, Au, Sn, Pb, In, Ag and the like. The adhesive (for example, Ag/epoxy, Ag/polyimide and Au/epoxy) or Ag-based wax and other adhesion method may be used. The thickness of the adhesive layer is usually from 0.01 to 10 μm.

When the high thermal conductivity material layer is diamond prepared by the chemical vapor deposition, the selective growth using a mask can be used to form the groove instead of the laser light or etching process. This is disclosed in Japanese Patent Kokai Publication Nos. 104761/1989 and 123423/1989. A mask material is positioned on the surface of the base material (for example, Si, SiC, Cu, Mo, cBN and the like) in the pattern corresponding to the desired groove, and diamond is deposited by the chemical vapor deposition. At this time, diamond grows in the vertical and horizontal directions by depositing at least 50 μm of diamond and covers the whole surface of the base material. After the base material is removed, for example, dissolved, the resultant diamond has the groove on the surface facing the base material. The mask made of Ti, Si, Mo or the like may be prepared by a conventional procedure. The advantage of this method is that diamond does not have a failure at the processing, since the impact is not applied to diamond after the growth of diamond.

In the above method, instead of the formation of the mask, the plate material itself is processed to form the concave and convex corresponding to the groove and then diamond is grown on the plate material by the chemical vapor deposition. After diamond having the desired thickness is grown, the plate material is removed to give the self-standing diamond film having the groove on the surface facing the plate material. Specific examples of the plate material are Si, SiC, Mo and the like.

When the chemical vapor deposited diamond is used as the high thermal conductivity material layer, the above method is modified so that the step of adhesion can be omitted. Namely, the mask is positioned on the base material, diamond is grown on the base material by the chemical vapor deposition and then only the mask is dissolved to give the substrate having the groove for flow of the cooling medium in the diamond at the interface between the base material and diamond. According to this method, the heat-dissipation efficiency can be further increased, since the adhesive is absent. Specific examples of the preferable base material are Si, SiC, Cu and Mo.

Any of the above methods is effective to prepare the substrate having the groove in the high thermal conductivity material layer at the interface between the high thermal conductivity and the base material. The method using the etching can precisely form the fine groove. The method using the laser processing can rapidly form the groove. The method using the selective growth (the method using the mask) can easily form the relatively large groove.

In the other embodiment of the substrate of the present invention, the top, bottom and sides of the flow path is surrounded by the high thermal conductivity material. The heat evolved from the heating element such as a semiconductor element positioned on the substrate is transmitted into the high thermal conductivity material at a small temperature gradient and removed by the cooling medium passing through the flow path.

The high thermal conductivity material preferably has a higher thermal conductivity, since the element temperature can be significantly decreased. The thermal conductivity of the high thermal conductivity material is preferably as large as possible, and is suitably at least 10 W/cm·K. Specific examples of the high thermal conductivity material are natural diamond, synthetic diamond by a high pressure and temperature method and chemical vapor deposited diamond. These are suitable for the high thermal conductivity material. When diamond prepared by the chemical vapor deposition, the high thermal conductivity material having relatively large area can be obtained at a cheap price. The thermal conductivity generally depends on the temperature. The thermal conductivity of diamond decreases, as the temperature increases in the range above the room temperature. In the case of the substrate mounting a usual element (for example, an electronic element such as semiconductor element), the temperature of the mounted element is at most between 100° C. and 200° C., and the high thermal conductivity material preferably has the thermal conductivity of at least 10 W/cm·K in this temperature range. The thickness of the substrate is preferably at least 30 μm, more preferably at least 70 μm. The upper limit of the thickness of the substrate is usually 10 mm, for example 5 mm. The high thermal conductivity material may be semiconductive or conductive, and is preferably insulative. The resistivity of the high thermal conductivity material is preferably at least $1 \times 10^8$ Ω·cm, more preferably at least $1 \times 10^9$ Ω·cm.

The flow path typically has a rectangular cross-sectional shape. The height of the flow path present in the high thermal conductivity material is preferably larger due to the increase of the heat exchange efficiency, but the very large height of the flow path disadvantageously gives the poor mechanical strength of the substrate. The height (c) of the flow path is preferably at least 20 μm, more preferably at least 50 μm. The height (c) of the flow path is preferably at most 90%, more preferably at most 80%, for example at most 70% of the substrate thickness. The larger width (a) of the flow path gives the larger heat exchange efficiency, but the very large width disadvantageously gives the smaller heat exchange efficiency due to the decreased number of the flow paths for maintaining the strength of the substrate. The space (b) between the flow paths is in the same manner as in the width, and the very large or small space disadvantageously gives the poor results. The width (a) of the flow path and the space (b) between the flow paths are preferably from 20 μm to 10 mm, more preferably from 40 μm to 2 mm, most preferably from 50 μm to 2 mm. The ratio (a/b) of the width (a) to the space (b) has the lower limit of preferably 0.02, more preferably 0.04 and the upper limit of preferably 50, more preferably 25. The ratio (a/c) of the width (a) to the height (c) has the lower limit of preferably 0.05, more preferably 0.1 and the upper limit of preferably 100, more preferably 50.

The optimum width, space and height are dependent on the element mounted on the substrate. The cross-sectional shape of the flow path need not be rectangular and may be a semicircular, semioval or complicated shape. In one substrate, the values of a, b and c may not be constant and can be varied in the above range. The ratio of substrate surface occupied by the flow path (the ratio of surface area occupied by the flow path to substrate surface area when viewed from a direction normal to the substrate surface) is usually 2 to 90%, preferably 10 to 80% of the surface area of the substrate. A angle (taper angle) between the side surface of the flow path and the line normal to the substrate surface is preferably at most 30°.

The flow path for passing the cooling medium can be suitably formed according to the position of the element such as the semiconductor element mounted on the substrate. The flow path is preferably formed so that a part having the highest temperature caused by the mounted heating element such as the semiconductor element or a part required to have the lowest temperature is most effectively cooled. The flow path is positioned so that the largest amount of the cooling medium passes in a part required to be most largely cooled. The cooling efficiency can be increased by complicating the cross-sectional shape of the flow path so as to increasing the surface area of the flow path. A part near an inlet for the cooling medium has a high cooling efficiency, since the cooling medium has the lowest temperature. Accordingly, when the heat distribution of the heating element is uniform, since a center part has the highest temperature, it is advantageously effective that the inlet is formed in the center part and the cooling flow path is positioned in a spiral or radial shape.

A layer of non-diamond carbon component (for example, graphite or noncrystalline carbon) having the thickness of 1 nm to 1 μm may be present on the surface of the flow path. The non-diamond layer can be prepared by heating the high thermal conductivity material layer at 1000°–1500° C. for 30 minutes to 10 hours (for example, 1 hour) in a non-oxidation atmosphere (for example, in an inert gas atmosphere) (In this case, the non-diamond layer is also formed on the surface of the high thermal conductivity other than flow path, and the non-diamond layer can be removed by a polishing process). The presence and absence of the non-diamond layer can be measured by Raman spectroscopy.

Wettability of the flow path surface by the cooling medium is preferably good. A contact angle is usually at most 65°, more preferably at most 60°. Since a surface of diamond has a hydrogen atom, the surface repels the cooling medium such as water in such state. It is possible to increase the hydrophilic property of the diamond surface layer by substituting the hydrophilic group having the oxygen atom (for example, OH group) for the hydrogen atom.

In order to increase the wettability of the flow path surface, the flow path is annealed at 500°–800° C. for 10 minutes to the 10 hours in an oxidation atmosphere (for example, an atmospheric environment) or processed by a plasma of oxygen or a gas containing oxygen. It is supposed that the hydrophilic property is somewhat increased when an oxygen plasma is used for the formation of the flow path, but the above procedure may be additionally conducted.

The process for improving the wettability of the flow path surface by the cooling medium includes a plasma treatment in a gas containing nitrogen, boron or inert gas.

Specific examples of the cooling medium are water, air, an inert gas (for example, nitrogen and argon), a fluorocarbon, liquid nitrogen, liquid oxygen, and liquid helium.

The element used in the present invention may be a semiconductor element, for example, a semiconductor laser, MPU (microprocessor unit) and IC. When the substrate of the present invention is used, the element is efficiently cooled so that the temperature increase of the element is prevented. If the element has the increased temperature, the wavelength of the semiconductor laser shifts to the longer wave length. However, in the present invention, the wave length never shifts to the longer wave length, since the element has no increased temperature.

Hereinafter, a method for preparing the substrate having the flow path surrounded by the high thermal conductivity material is explained.

The substrate can be prepared by directly perforating the substrate to form the flow path by the laser process and the like. The substrate can be prepared by forming the groove in one film and attaching said film to another film.

In the former method, a plate comprising the high thermal conductivity material having the desired shape is provided, and the laser light is focused to the side face of the plate for perforation to form the flow path for the cooling medium passage in the high thermal conductivity material plate.

A method of attaching a first high thermal conductivity material film to a second high thermal conductivity material film is explained as follows. The first high thermal conductivity material film has a groove forming a flow path and the second thermal conductivity material film has no groove. A high thermal conductivity material is provided in a desired size. On one surface of the first high thermal conductivity material film, the flow path, which is then embedded in the final substrate, is formed by a processing method using laser light or by a selective etching.

The laser processing comprises removing the material by focusing the laser light on the material surface to form the groove on the surface. According to this process, the flow path having the arbitrary positioning can be obtained. The laser light having sufficient energy density is focused on the surface of the high thermal conductivity material film and the focused position is moved while removing the material to form the groove on the surface. Specific examples of the laser light are YAG laser and excimer laser. The excimer laser is preferable, since the groove having the arbitrary height and position can be reproductively formed because of the processing preciseness.

The wave length of the laser light is preferably at most 360 nm, for example 190 to 360 nm. The energy density of the irradiated light is usually from 10 to $10^{11}$ W/cm$^2$. A pulse laser light, which preferably has an energy density per one pulse between $10^{-1}$ J/cm$^2$ and $10^6$ J/cm$^2$ is preferable. The divergence of the laser light generated from the laser generator is preferably from $10^{-2}$ mrad to $5\times10^{-1}$ mrad, and a band width of the laser light is preferably from $10^{-4}$ nm to 1 nm. A uniformity of the energy distribution in the beam cross-section of the laser light is preferably at most 10%. Good process results can be obtained by focusing the pulse laser light by a cylindrical lens or a cylindrical mirror.

In such flow path formation on the surface by the excimer laser, the processing in the suitable atmosphere can modify the diamond surface and can improve the wettability of the surface by the cooling medium. For example, the above processing in the atmosphere containing an amino group-containing compound (for example, ammonia or hydrazine) can give the amino group on the surface of the formed flow path to increase the hydrophilic property.

The flow path formation by the etching process can be conducted as follows. After a suitable mask is formed on the high thermal conductivity material film, the treatment is conducted under the condition that the mask is not etched and only the high thermal conductivity material is etched. Then the mask is removed to give the first high thermal conductivity material film having the groove on the surface. It is known that the mask material such as Al and $SiO_2$ is formed on diamond and then diamond is selectively etched by oxygen or a gas containing oxygen to form the flow path on diamond (cf. page 411 of volume 11 of Preprint of 53th meeting of the Japanese Applied Physics Society). Nitrogen or hydrogen may be used instead of oxygen or the gas containing oxygen.

The first high thermal conductivity material film having the desired groove is adhered to the separately provided second high thermal conductivity material film to give the substrate having the very large heat dissipation efficiency. The second high thermal conductivity material film may provisionally have an inlet and outlet for introducing (and discharging) the cooling medium into the flow path formed in the high thermal conductivity material layer.

Although the method for providing only the first high thermal conductivity material film with the groove is explained in the above, it is possible that the groove is formed also on the second high thermal conductivity material film and a surface of the first high thermal conductivity material film having the groove is adhered to a surface of the second high thermal conductivity material film having the groove. Since this method has a complicated process, it is preferable to form the groove on only the first high thermal conductivity material film.

The adhesion of the first high thermal conductivity material film to the second high thermal conductivity material can be conducted by a metallization treatment or an adhesive. Two adhered surfaces may be metallized by a conventional procedure and the metal may be molten. Specific examples of the metal used in the metallization treatment are Ti, Pt, Au, Sn, Pb, In, Ag and the like. The adhesive (for example, Ag/epoxy, Ag/polyimide and Au/epoxy) or Ag-based wax and other adhesion method may be used. The thickness of the adhesive layer is usually from 0.01 to 10 µm.

When the high thermal conductivity material film is diamond prepared by the chemical vapor deposition process, the selective growth using a mask can be used to form the flow path instead of the laser light or etching process.

This is disclosed in Japanese Patent Kokai Publication Nos. 104761/1989 and 123423/1989. A mask material is positioned on the surface of the base material (for example, Si, SiC, Cu, Mo, cBN and the like) in the pattern corresponding to the desired flow path, and diamond is deposited by the chemical vapor deposition. At this time, diamond grows in the vertical and horizontal directions by depositing at least 50 µm of diamond and covers the whole surface of the base material. After the base material is removed, for example, dissolved, the resultant diamond has the flow path on the surface facing the based material. The mask made of Ti, Si, Mo or the like may be prepared by a conventional procedure. The advantage of this method is that diamond does not have a failure at the processing, since the impact is not applied to diamond after the growth of diamond.

In the above method, instead of the formation of the mask, the plate material itself is processed to form the concave and convex corresponding to the flow path and then diamond is grown on the plate material by the chemical vapor deposition. After diamond having the desired thickness is grown, the plate material is removed to give the self-standing diamond film having the flow path on the surface facing the plate material. Specific examples of the plate material are Si, SiC, Mo and the like.

When the chemical vapor deposited diamond is used as the high thermal conductivity material films, the above method is modified so that the step of adhesion can be omitted. Namely, the mask is positioned on a diamond film, diamond is grown on the diamond film by the chemical vapor deposition and then only the mask is dissolved to give the substrate having the flow path. According to this method, the heat-dissipation efficiency can be further increased, since the adhesive is absent.

Any of the above methods is effective to prepare the substrate having the flow path in the high thermal conductivity material. The method using the etching can precisely form the fine flow path. The method using the laser processing can rapidly form the flow path. The method using the selective growth (the method using the mask) can easily form the relatively large flow path.

A hole is formed in the resultant substrate by a perforation process using a laser light. The hole can be prepared during the preparation of the substrate, for example, by a selective growth and an etching. The electrical wiring may be formed in the hole and on the substrate. A plurality of the substrate having the electrical wiring are piled to give a semiconductor device. The wiring in the hole conducts the electrical connection between the substrates. The number of the substrates in the semiconductor device is at least 2. The number of the substrates may be at most 200, for example, at most 50. The cooling medium may pass from a part of the semiconductor device, for example, a side surface of the substrate, through the flow path of each substrate.

The present invention is illustrated with reference to the attached drawings.

FIG. 1 is a schematic plane view of a grooved high thermal conductivity material layer according to the present invention. The high thermal conductivity material 11 has a groove 12 in the form that the surface having no groove is interdigital.

Figure 2:
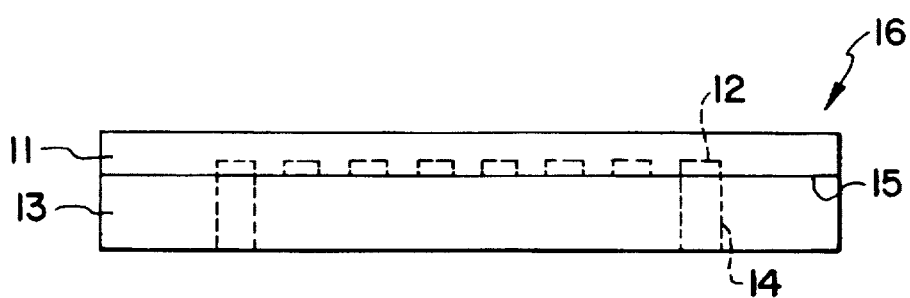
FIG. 2 is a schematic front view of a substrate according to the present invention.

FIG. 2 is a schematic front view of a heat-dissipating substrate according to the present invention. The heat-dissipating substrate 16 comprises a high thermal conductivity material layer 11, a base material 13 and an adhesive layer 15. The base material 13 has two gates 14 for the cooling medium connecting the groove 12. The size and number of the gate 14 in the substrate 13 are not limited. For example, each part of the substrate corresponding the both ends of groove may have the gate for the cooling medium.

Figure 3:
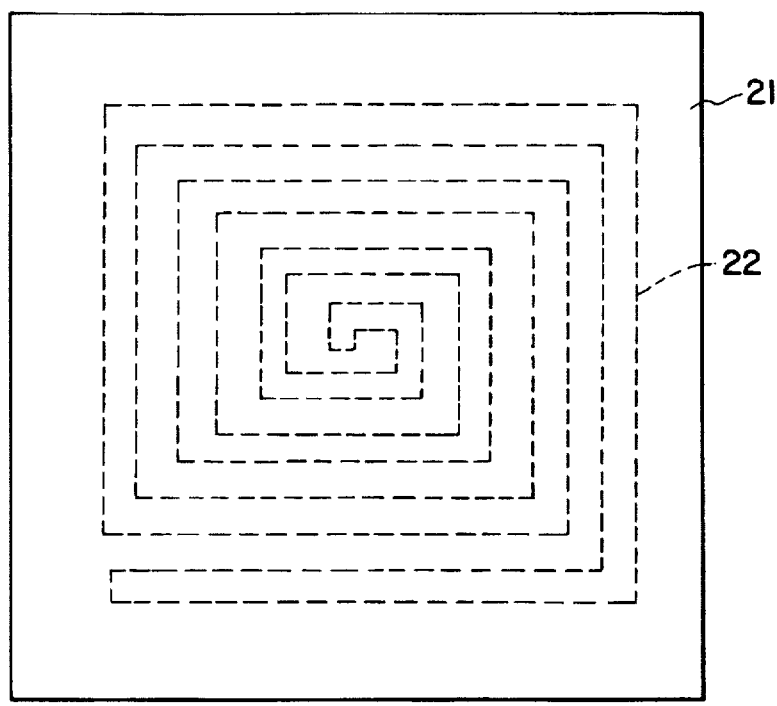
FIG. 3 is a schematic plane view of a high thermal conductivity material layer having a groove according to the present invention.

FIG. 3 is a schematic plane view of a high thermal conductivity material layer according to the present invention. The high thermal conductivity material layer 21 has the spiral groove 22.

Figure 4:
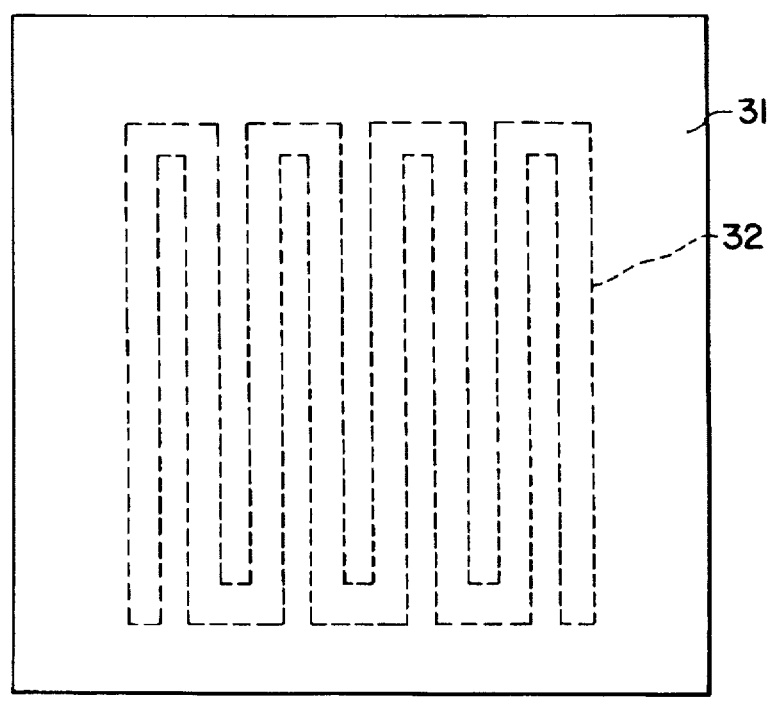
FIG. 4 is a schematic plane view of a heat-dissipating substrate comprising a grooved AlN layer of Comparative Example 1 excluded from the present invention.

FIG. 4 is a schematic plane view of a grooved AlN layer of Comparative Example 1 excluded from the present invention. A groove 32 having the same shape as in FIG. 1 is formed in an AlN layer 31.

Figure 5:
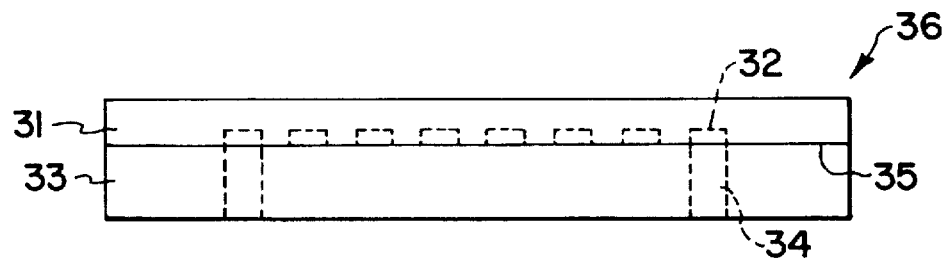
FIG. 5 is a schematic front view of a grooved AlN layer of Comparative Example 1 excluded from the present invention.

FIG. 5 is a front view of a heat-dissipating substrate comprising a grooved AlN layer of Comparative Example 1 excluded from the present invention. The heat-dissipating substrate 36 has an AlN layer 31, a base material 33 and an adhesive layer 35. The base material 33 has two gates 34 for the cooling medium connecting the groove 32.

Figure 6:
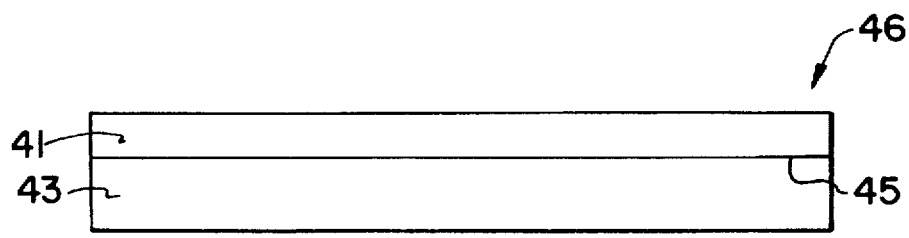
FIG. 6. is a schematic front view of a prior art heat-dissipating substrate of Comparative Example 2 excluded from the present invention.

FIG. 6 is a schematic front view of a prior art heat-dissipating substrate of Comparative Example 2 excluded from the present invention. A substrate 46 comprises a diamond layer 41 having no groove, a base material 43 and an adhesive layer 45.

Figure 7:
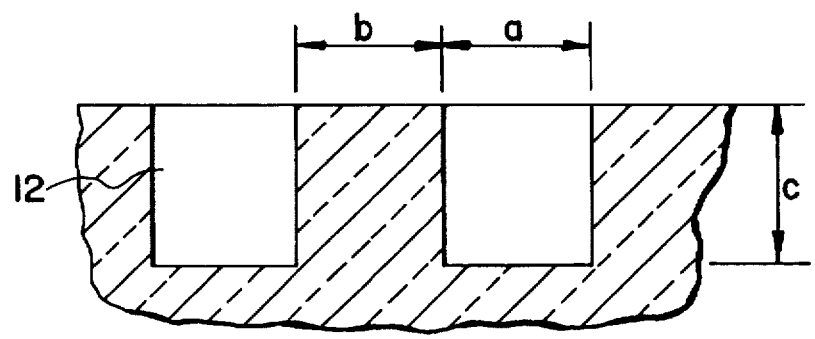
FIG. 7 is a cross-sectional view of a groove formed in a high thermal conductivity material layer according to the present invention.

FIG. 7 is a cross-sectional view of groove formed in a high thermal conductivity material according to the present invention. A groove 12 has a width (a) and a depth (c) and is formed at a space (b).

Figure 8:
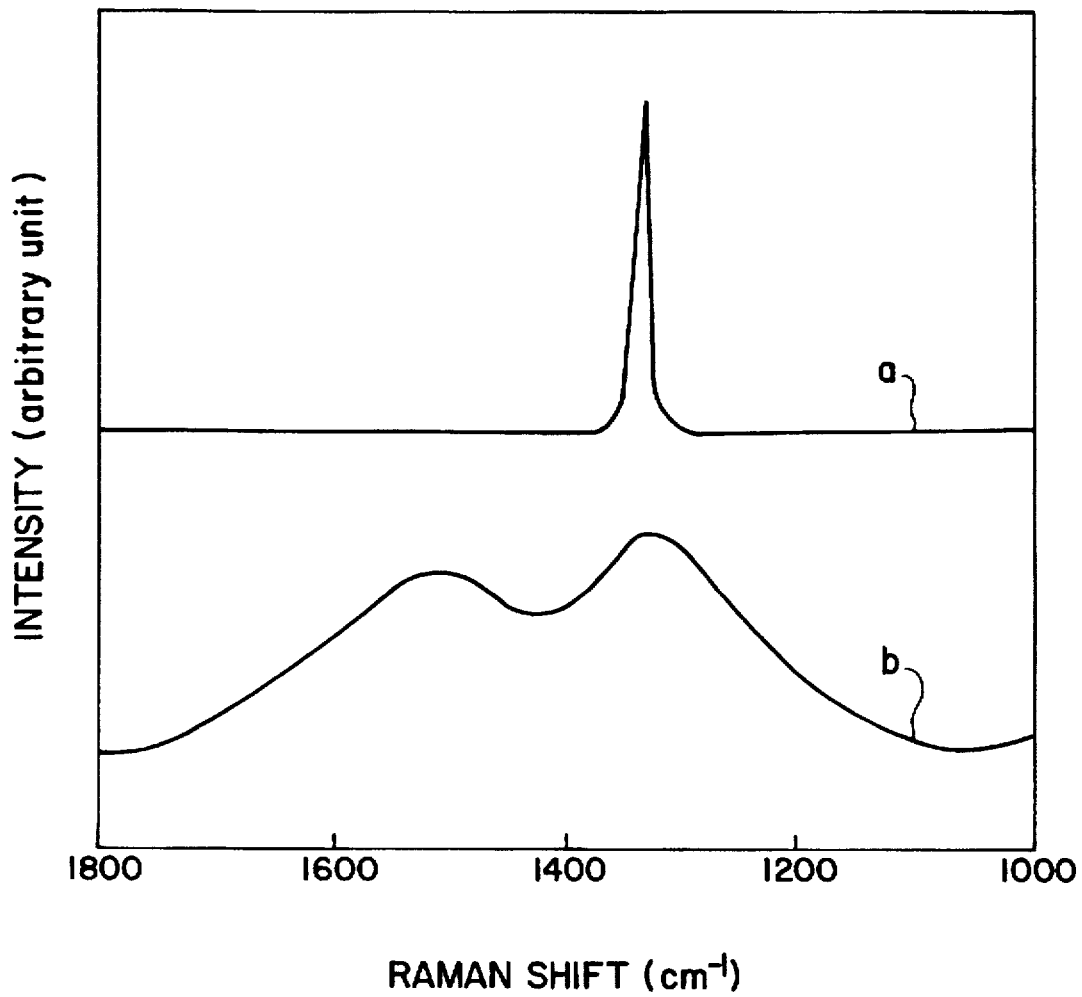
FIG. 8 is Raman spectroscopies of diamond and non-diamond carbon.

FIG. 8 is a Raman spectroscopy of diamond and non-diamond carbon. The curve a is spectrum of diamond, and has a strong peak at 1333 cm$^{-1}$. The curve b is a spectrum of a material largely containing non-diamond carbon and has two broad peaks.

Figure 9:
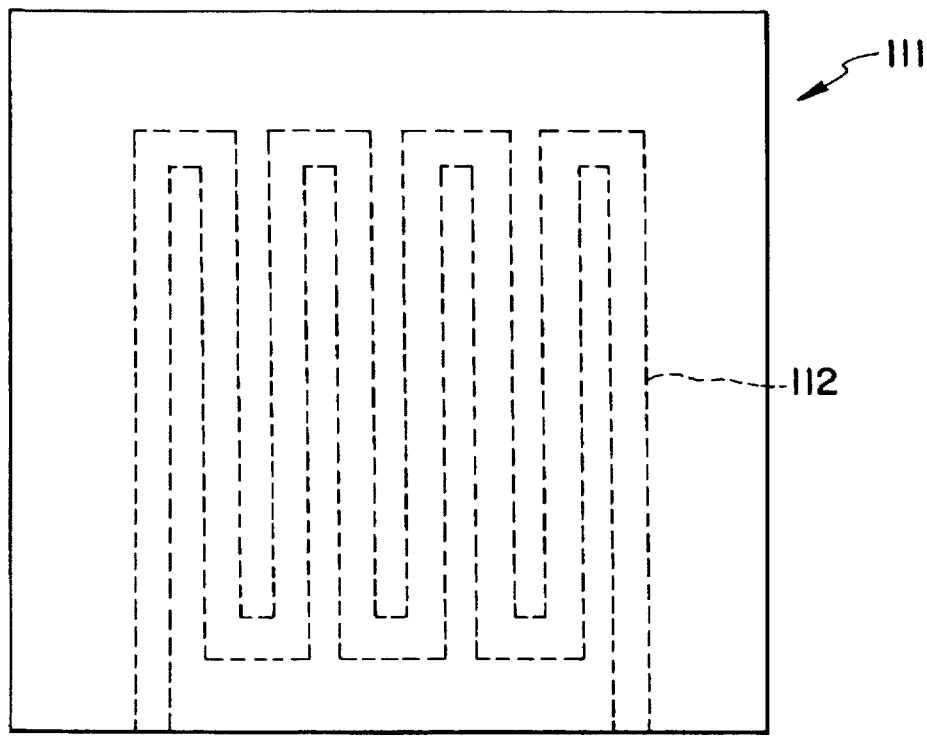
FIG. 9 is a schematic plane view of a substrate according to the present invention in which a high thermal conductivity material surrounds a circumference of flow path.

FIG. 9 is a schematic plane view of a substrate having a flow path surrounded by a high thermal conductivity material according to the present invention. The substrate 111 has a flow path 112. The flow path 112 is embedded in the substrate.

Figure 10:
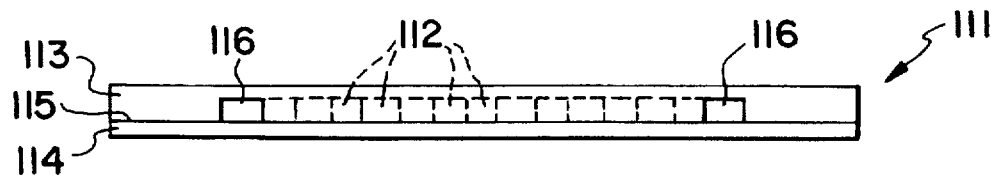
FIG. 10 is a schematic front view of the substrate shown in FIG. 9.

FIG. 10 is a schematic front view of the substrate shown in FIG. 9. A substrate 111 has a first high thermal conductivity material film 113 having a flow path 112, a second high thermal conductivity material film 114 and an adhesive layer 115. The flow path 112 connects to gates 116 for the cooling medium. The gates 116 may be in the other position and, for example, may be positioned on a main surface of the first high thermal conductivity material film 113 or the second high thermal conductivity material film 114. The size and number of the gate are not limited.

Figure 11:
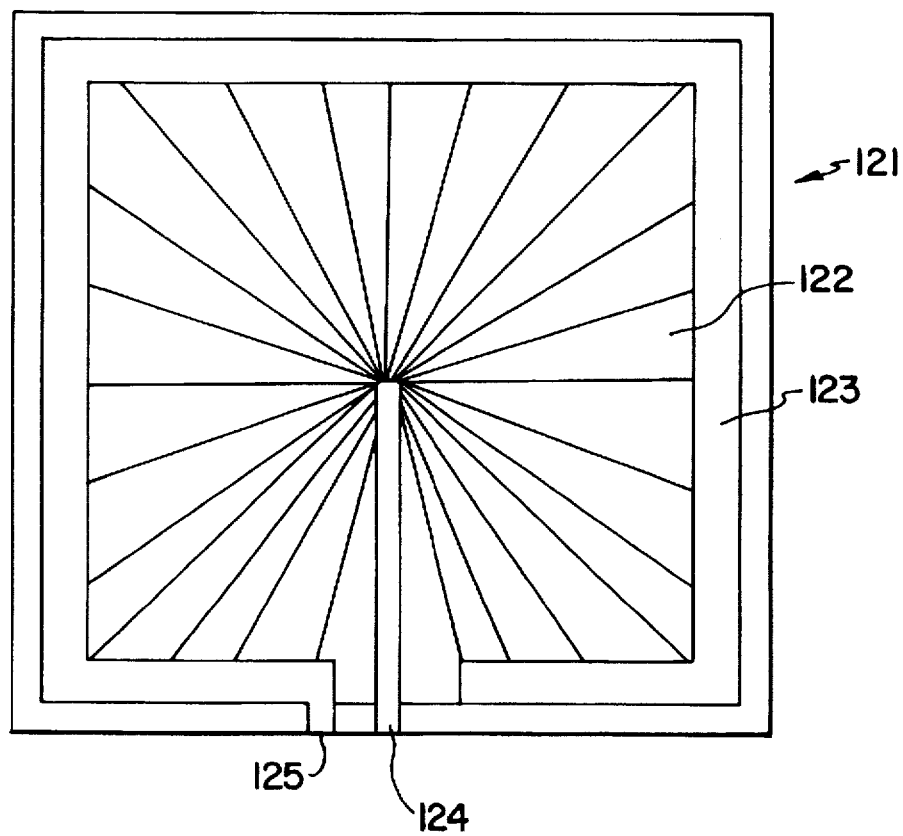
FIG. 11 is a schematic plane view of additional embodiment of a substrate according to the present invention in which a high thermal conductivity material surrounds a circumference of flow path.

FIG. 11 is a schematic plane view of additional embodiment of a substrate according to the present invention in which a high thermal conductivity material surrounds a circumference of flow path. A substrate 121 has radial flow paths 122. There is an additional flow path 123 connecting the flow paths 122 so that the additional flow path 123 surrounds the flow paths 122. The flow path 122 connects to an inlet 124 for the cooling medium and the flow path 123 connects to an outlet 125 for the cooling medium.

Figure 12:
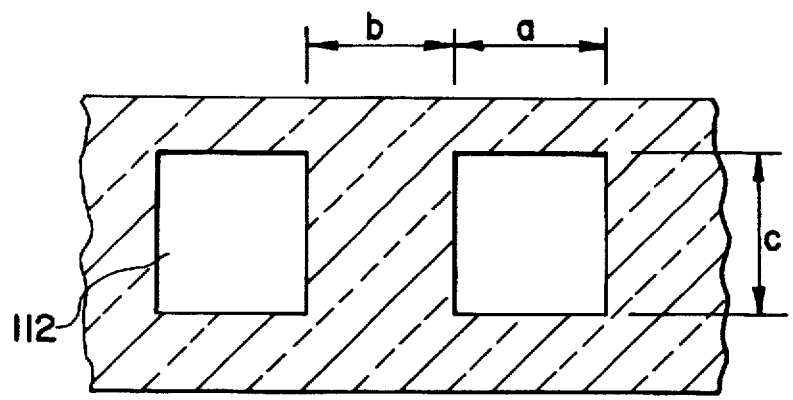
FIG. 12 is a cross-sectional view of a flow path formed in a substrate according to the present invention.

FIG. 12 is a cross-sectional view of a flow path formed in a substrate according to the present invention. A flow path 112 has a width (a) and a height (c) and is formed at a space (b).

Figure 13:
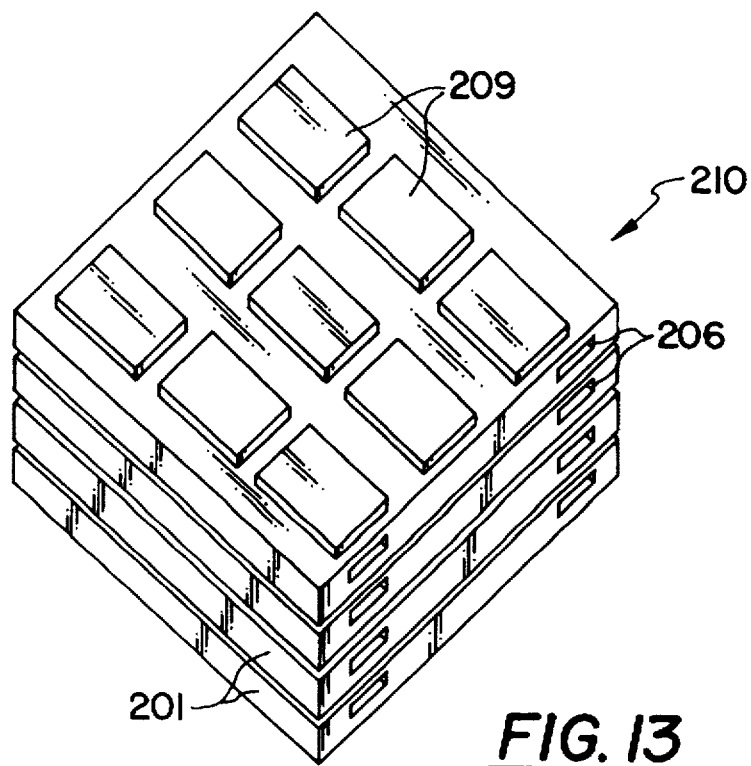
FIG. 13 is a schematic perspective view of a semiconductor device of the present invention.

FIG. 13 is a schematic perspective view of a semiconductor device (a three-dimensional IC substrate) of the present invention. The semiconductor device 210 has four substrates 201. Each substrate 201 is made of diamond and is the same as the substrate shown in FIG. 9. Each substrate 201 has two gates 206 for the cooling medium and nine ICs 209.

Figure 14:
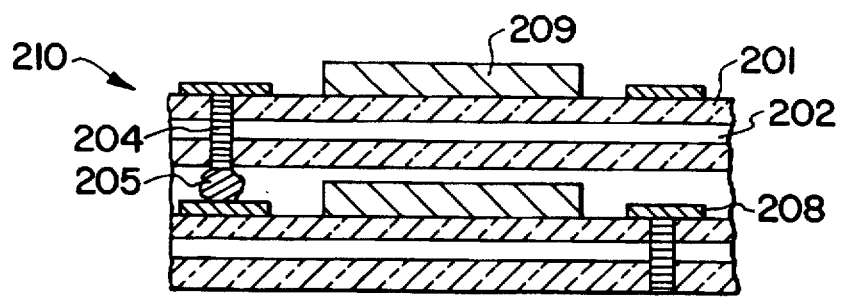
FIG. 14 is a schematic cross-sectional view of a part of the semiconductor device of FIG. 13.

FIG. 14 is a schematic cross-sectional view of a part of the semiconductor device of FIG. 13. Two substrate 201 can be seen from FIG. 14. IC (an electronic element) 209 and a metal wiring 208 are positioned on a substrate 201. The metal wiring 208 (for example, made of Au) positioned on one substrate is connected through a viahole 204 and a solder bump 205 to the metal wiring 208 positioned on the other substrate. The substrate 201 has a flow path 202 for the flow of the cooling medium.

Figure 15:
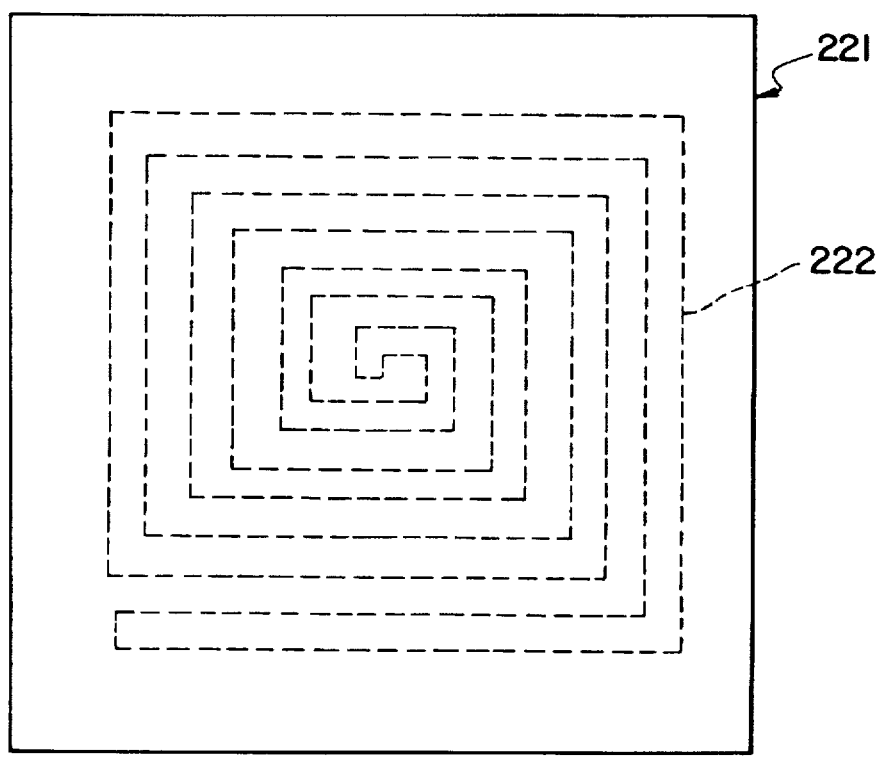
FIG. 15 is a schematic plane view of another embodiment of a substrate according to the present invention in which a high thermal conductivity material surrounds a circumference of flow path.

FIG. 15 is a schematic plane view of another embodiment of a substrate according to the present invention in which a high thermal conductivity material surrounds a circumference of flow path. A spiral flow path 222 is embedded in the high thermal conductivity material 221.

PREFERRED EMBODIMENTS OF THE INVENTION

The present invention is illustrated by the following Examples which do not limit the present invention.

EXAMPLE 1

CVD, groove formation by laser, adhesion

On a scratched polycrystal Si base material (10 mm×10 mm×(thickness) 2 mm), diamond was grown by a microwave plasma enhanced CVD method. The growth conditions included a methane 1%-hydrogen system, a pressure of 80 Torr and a base material temperature of 900° C. After the growth for 400 hours, a growth surface was polished and the Si base material was dissolved in an acid to give a self-standing diamond film having a size of 10 mm×10 mm× (thickness) 0.5 mm. A thermal conductivity was measured to be 17.2 W/cm·K.

On one surface of the resultant self-standing diamond film, a KrF excimer laser was pointedly and linearly focused to form a groove shown in FIG. 1. The groove had a depth of about 150 µm, a width of about 500 µm and a space of about 400 µm. After Ti, Pt and Au were vapor-deposited on both of the diamond film and a CuW alloy film, the diamond film was adhered to the CuW alloy film. The thickness of a Ti/Pt/Au/Pt/Ti layer was 0.1 µm. The CuW alloy film provisionally had gates (diameter: 400 µm) for the cooling medium passing through the groove of diamond.

In the groove of the resultant diamond/CuW substrate, cooling water (temperature: 25° C.) was supplied. A thermal resistance between the diamond surface and cooling water was measured to be 0.014° C./W.

An infrared-emitting semiconductor laser element (1 mm×1 mm×0.5 mm) (output density: 5.3 W/cm$^2$) was mounted on the grooved diamond layer and the desired wiring was formed to prepare a laser element-mounted device. A metal (Au) wiring was formed by a conventional patterning on the diamond surface.

Cooling water (temperature: 25° C.) was supplied in the groove of the laser element-mounted device. The laser element was oscillated. A change (particularly, a change of a generated wave length) was not observed for a long time.

EXAMPLE 2

High pressure synthesis, grooving by laser and adhesion

Using a Ib type diamond (8 mm×8 mm×(thickness) 0.6 mm, thermal conductivity: 18.3 W/cm·K) prepared by a high temperature and high pressure method, a grooved diamond/CuW substrate was prepared in the same manner as in Example 1, except that the groove formed in diamond by an ArF excimer laser had a depth of about 200 µm, a width of about 350 µm and a space of about 400 µm (cf. FIG. 3). Two holes (circular shape having a diameter of about 350 µm) which were gates for the cooling medium were perforated in the substrate by pointedly focusing a KrF excimer laser.

Cooling water (temperature: 25° C.) was supplied in the grooved diamond/CuW substrate. In this case, a thermal resistance between the diamond surface and cooling water was measured to be 0.021° C./W.

An infrared-emitting semiconductor laser element (1 mm×1 mm×0.5 mm) (output density: 5.3 W/cm$^2$) was mounted on the grooved diamond layer and the desired wiring was formed to prepare a laser element-mounted device. A metal (Au) wiring was formed by a conventional patterning on the diamond surface.

Cooling water (temperature: 25° C.) was supplied in the groove of the laser element-mounted device. The laser element was oscillated. A change (particularly, a change of a generated wave length) was not observed for a long time.

Comparative Example 1

AlN, grooved

On one surface of AlN base material (10 mm×10 mm× (thickness) 0.5 mm, thermal conductivity: 1.9 W/cm·K), a KrF excimer laser was linearly focused in the same manner as in Example 1 to form a groove. The groove had a depth of about 150 µm, a width of about 500 µm and a space of about 400 µm. The grooved AlN film was adhered to a CuW alloy film. The CuW alloy film provisionally had gates for a cooling medium passing through the groove of AlN (cf FIG. 5).

In the groove of the resultant AlN/CuW substrate, the cooling water (temperature: 25° C.) was supplied. A thermal resistance between the AlN surface and the cooling water was measured to be 0.098° C./W.

An infrared-emitting semiconductor laser element (1 mm×1 mm×0.5 mm) (output density: 5.3 W/cm$^2$) was mounted on the grooved AlN layer and the desired wiring was formed to prepare a laser element-mounted device. A metal (Au) wiring was formed by a conventional patterning on the diamond surface.

Cooling water (temperature: 25° C.) was supplied in the groove of the laser element-mounted device. The laser element was oscillated. A gradual shift of a generated wave length to a longer wave length was observed.

Comparative Example 2

CVD, no groove

A chemical vapor deposited self-standing diamond film having a size of 10 mm×10 mm×0.5 mm (thermal conductivity: 17.2 W/cm·K) was prepared in the same manner as in Example 1. Without forming a groove, the diamond film was adhered to a CuW alloy film (cf. FIG. 6). While air having a temperature of 25° C. was blown on the back surface of the substrate, a thermal resistance was measured to be 3.4° C./W.

An infrared-emitting semiconductor laser element (1 mm×1 mm×0.5 mm) (output density: 5.3 W/cm$^2$) was mounted on the diamond layer to prepare a laser element-mounted device. While air having a temperature of 25° C. was blown on the back surface of the substrate, the laser element was oscillated. A gradual shift of a generated wave length to a longer wave length was observed.

Comparative Example 3

CVD, very narrow groove

A chemical vapor deposited self-standing diamond film having a size of 10 mm×10 mm×0.5 mm (thermal conductivity: 17.2 W/cm·K) was prepared in the same manner as in Example 1. On the diamond film, a KrF excimer laser was linearly focused to form a groove. The groove had a depth of about 150 µm, a width of about 10 µm and a space of about 990 µm. The grooved diamond film was adhered to a CuW alloy film. The CuW alloy film provisionally had gates for a cooling medium passing through the groove of diamond.

In the groove of the resultant diamond/CuW substrate, the cooling water (temperature: 25° C.) was supplied. A thermal resistance between the diamond surface and the cooling water was measured to be 0.34° C./W.

An infrared-emitting semiconductor laser element (1 mm×1 mm×0.5 mm) (output density: 5.3 W/cm$^2$) was mounted on the grooved diamond layer to prepare a laser element-mounted device.

Cooling water (temperature: 25° C.) was supplied in the groove of the laser element-mounted device. The laser element was oscillated. A gradual shift of a generated wave length to a longer wave length was observed.

Results of Examples 1 and 2 and Comparative Examples 1 to 3 are shown in Table 1.

TABLE 1

|  | Ex. 1 | Ex. 2 | Com. Ex. 1 | Com. Ex. 2 | Com. Ex. 3 |
| --- | --- | --- | --- | --- | --- |
| High thermal conductivity material layer | CVD diamond | HPHT diamond | AlN | CVD diamond | CVD diamond |
| Thermal conductivity (W/cm · K) | 17.2 | 18.3 | 1.9 | 17.2 | 17.2 |
| Thickness (mm) | 0.5 | 0.6 | 0.5 | 0.5 | 0.5 |
| Groove width (a) (mm) | 0.5 | 0.35 | 0.5 | None | 0.01 |
| Groove space (b) (mm) | 0.4 | 0.4 | 0.4 | None | 0.99 |
| Groove depth (c) (mm) | 0.15 | 0.2 | 0.15 | None | 0.15 |
| a/b | 1.25 | 0.88 | 1.25 | — | 0.01 |
| Thermal resistance (°C./W) | 0.014 | 0.021 | 0.098 | 3.4 | 0.34 |

EXAMPLE 3
Annealing in air

The grooved diamond film shown in FIG. 1 was prepared in the same manner as in Example 1. After the diamond film was annealed in air at 600° C. for 30 minutes, the diamond film was adhered to a CuW base material in the same manner as in Example 1. Cooling water (temperature:25° C.) was supplied in the groove of the resultant grooved diamond/CuW substrate. The thermal resistance between the diamond surface and the cooling medium was measured to be 0.012° C./W.

An infrared-emitting semiconductor laser element (1 mm×1 mm×0.5 mm) (output density: 5.3 W/cm$^2$) was mounted on the diamond layer to prepare a laser element-mounted device. While water was supplied in the substrate, the laser element was oscillated. A change (particularly, a change of a generated wave length) was not observed for a long time.

EXAMPLE 4
Annealing under vacuum

The grooved diamond film shown in FIG. 1 was prepared in the same manner as in Example 1. The diamond film was annealed under vacuum at 1,200° C. for 30 minutes. The Raman spectroscopy of the diamond film was measured. As shown in FIG. 8 (b), the peak showing the non-diamond carbon was observed.

The diamond film was adhered to a CuW base material in the same manner as in Example 1. Cooling water (temperature:25° C.) was supplied in the groove of the resultant grooved diamond/CuW substrate. The thermal resistance between the diamond surface and the cooling medium was measured to be 0.011° C./W.

An infrared-emitting semiconductor laser element (1 mm×1 mm×0.5 mm) (output density: 5.3 W/cm$^2$) was mounted on the diamond layer to prepare a laser element-mounted device. While the cooling water (temperature:25° C.) was supplied in the substrate, the laser element was oscillated. A change (particularly, a change of a generated wave length) was not observed for a long time.

EXAMPLE 5
On a diamond layer of a substrate prepared in the same manner as in Example 1, a MPU chip (very large number of circuits are formed on a Si chip) was mounted by a TAB technique with the preparation of the suitable wiring. While cooling water (temperature: 25° C.) was flown in a flow path prepared in the substrate, the semiconductor device was operated. The device operated for long time without a wrong operation.

EXAMPLE 6
A grooved diamond film shown in FIG. 1 was obtained in the same manner as in Example 1. The film was treated with a microwave in a hydrogen atmosphere at 100 Torr and 800° C. for 30 minutes. A Raman spectroscopy of the sample was measured. The result has the sharp peak as shown in FIG. 8 (a).

Then, the grooved diamond film was adhered to a CuW base material in the same manner as in Example 1. Cooling water (temperature:25° C.) was supplied in the groove of the resultant grooved diamond/CuW substrate. The thermal resistance between the diamond surface and the cooling medium was measured to be 0.038° C./W.

EXAMPLE 7
CVD, flow path formation by laser, adhesion

Two scratched polycrystal Si base materials (10 mm×10 mm×thickness 2 mm) were provided. Diamond was grown on the base material by a microwave plasma enhanced CVD method. The growth conditions included a methane 1%-hydrogen system, a pressure of 80 Torr and a base material temperature of 900° C. After the growth for 300 hours in the case of one base material and for 200 hours in the case of the other base material, a growth surface was polished and the Si base material was dissolved in an acid to give two self-standing diamond films, one film having a size of 10 mm×10 mm ×(thickness) 0.3 mm and the other film having a size of 10 mm×10 mm ×(thickness) 0.15 mm. A thermal conductivity was measured to be 17.2 W/cm·K (for one film having the thickness of 0.3 mm, referred to as a first self-standing diamond film) and 16.9 W/cm·K (for the other film having the thickness of 0.15 mm, referred to as a second self-standing diamond film).

On one surface of the first self-standing diamond film (having the thickness of 0.3 mm), a KrF excimer laser was pointedly and linearly focused to form a groove shown in FIG. 9. The groove had a depth of about 150 μm, a width of about 500 μm and a space of about 400 μm. After Ti, Pt and Au were vapor-deposited on both of the diamond films, the first self-standing diamond film was adhered to the second self-standing diamond film by melting Au to give a substrate (cf. FIGS. 9 and 10). The thickness of a Ti/Pt/Au/Pt/Ti layer was 0.1 μm. A side face of the substrate had gates for the cooling medium passing through the groove of diamond substrate.

An infrared-emitting semiconductor laser element (1 mm×1 mm×0.5 mm) (output density: 5.3 W/cm$^2$) was mounted on the first self-standing diamond film and the desired wiring was formed to prepare a laser element-mounted device. A metal (Au) wiring was formed by a conventional patterning on the diamond surface.

Cooling water (temperature: 25° C.) was supplied in the flow path of the laser element-mounted device. The laser element was oscillated. A change (particularly, a change of a generated wave length) was not observed for a long time.

Five substrates as in the above were prepared. Five to ten of LSI chips were mounted on each substrate. The perforation process of each substrate for the preparation of the wiring was conducted by an excimer laser. The resultant hole had a diameter of 0.1 to 0.5 mm. The electrical wiring of Au was made in and on the substrate.

The five resultant substrates were piled to give a semiconductor device. The semiconductor device could have elements having a total heat thirty times as large as a total heat evolved in a conventional MCM substrate comprising AlN.

Cooling water (temperature: 25° C.) was supplied in the flow path of each substrate. The semiconductor device could operate without a wrong operation.

EXAMPLE 8

A first self-standing diamond film and a second self-standing diamond film were prepared in the same manner as in Example 7. The groove formed in the first self-standing diamond film was radial as shown in FIG. 11. The first self-standing diamond film was positioned in a vacuum oven and annealed at 1,200° C. for 30 minutes. A Raman spectroscopy of the first self-standing diamond film showed the peak corresponding to the non-diamond component as shown in FIG. 8 (b). Then, the second self-standing diamond film was adhered to the first self-standing diamond film in the same manner as in Example 7 to give a diamond substrate.

Five substrates as in the above were prepared. Five to ten of LSI chips were mounted on each substrate. The perforation process of each substrate for the preparation of the wiring was conducted by an excimer laser. The resultant hole had a diameter of 0.1 to 0.5 mm. The electrical wiring of Au was made in and on the substrate.

The five resultant substrates were piled to give a semiconductor device. The semiconductor device could have elements having a total heat thirty times as large as a total heat evolved in a conventional MCM substrate comprising AlN.

Cooling water (temperature: 25° C.) was supplied in the flow path of each substrate. The semiconductor device could operate without a wrong operation.

EXAMPLE 9

HPHT synthesis, a flow path formation by laser, adhesion

Using Ib type diamond prepared at a high pressure and high temperature method [a first self-standing diamond film (8 mm×8 mm×(thickness) 0.4 mm, thermal conductivity 18.3 W/cm·K) and a second self-standing diamond film (8 mm×8 mm×(thickness) 0.2 mm, thermal conductivity 18.3 W/cm·K), a diamond substrate having a flow path was prepared in the same manner as in Example 7. On one surface of the first self-standing diamond film, an ArF excimer laser was focused to form a groove shown in FIG. 15 and the groove had a depth of about 200 µm, a width of about 350 µm and a space of about 400 µm. Two holes (a circular shape having a diameter of about 350 µm) corresponding to the gates for a cooling medium passing through the flow path were prepared by a pointedly focused KrF excimer laser.

Cooling water (temperature: 25° C.) was supplied in the flow path of the resultant diamond substrate. The thermal resistance between the diamond surface and the cooling medium water was measured to be 0.013° C./W.

An infrared-emitting semiconductor laser element (1 mm×1 mm×0.5 mm) (output density: 5.3 W/cm$^2$) was mounted on the first self-standing diamond film and the desired wiring was formed to prepare a laser element-mounted device. A metal (Au) wiring was formed by a conventional patterning on the diamond surface.

Cooling water (temperature: 25° C.) was supplied in the flow path of the laser element-mounted device. The laser element was oscillated. A change (particularly, a change of a generated wave length) was not observed for a long time.

Comparative Example 4

AlN, presence of flow path

On one surface of a first self-standing AlN film (10 mm×10 mm×(thickness) 0.5 mm, thermal conductivity: 1.8–1.9 W/cm·K), a KrF excimer laser was focused in the same manner as in Example 7 to form a groove. The groove had a depth of about 150 µm, a width of about 500 µm and a space of about 400 µm. The first self-standing AlN film was adhered to a second self-standing AlN film (10 mm×10 mm×(thickness) 0.3 mm, thermal conductivity: 1.8-1.9 W/cm·K) to give an AlN substrate having a flow path.

Cooling water (temperature:25° C.) was supplied in the flow path of the resultant AlN substrate. The thermal resistance between the diamond surface and the cooling medium water was measured to be 0.088° C./W.

An infrared-emitting semiconductor laser element (1 mm×1 mm×0.5 mm) (output density: 5.3 W/cm$^2$) was mounted on the first self-standing AlN film and the desired wiring was formed to prepare a laser element-mounted device. A metal (Au) wiring was formed by a conventional patterning on the AlN surface.

Cooling water (temperature: 25° C.) was supplied in the flow path of the laser element-mounted device. The laser element was oscillated. The gradual shift of a generated wave length to a longer wave length was observed.

Comparative Example 5

A chemical vapor deposited self-standing diamond film having a size of 10 mm×10 mm×0.5 mm (thermal conductivity: 17.2 W/cm·K) was prepared in the same manner as in Example 7. While air having a temperature of 25° C. was blown on the back surface of the substrate, a thermal resistance was measured to be 2.8° C./W.

An infrared-emitting semiconductor laser element (1 mm×1 mm×0.5 mm) (output density: 5.3 W/cm$^2$) was mounted on the diamond film to prepare a laser element-mounted device. While air having a temperature of 25° C. was blown on the back surface of the substrate, the laser element was oscillated. A gradual shift of a generated wave length to a longer wave length was observed.

Comparative Example 6

CVD, very narrow flow path

A first self-standing diamond film (size: 10 mm×10 mm×0.3 mm, thermal conductivity: 17.2 W/cm·K) and a second self-standing diamond film (size: 10 mm×10 mm×0.15 mm, thermal conductivity: 17.2 W/cm·K) were prepared by a chemical vapor deposition in the same manner as in Example 7. On the first diamond film, a KrF excimer laser was focused in the same manner as in Example 7 to form a groove as shown in FIG. 9. The groove had a depth of about 150 µm, a width of about 10 µm and a space of about 990 µm. The grooved first self-standing diamond film was adhered to the second self-standing diamond film to form a diamond substrate.

In the flow path of the resultant diamond/CuW substrate, the cooling water (temperature: 25° C.) was supplied. A thermal resistance between the diamond surface and the cooling water was measured to be 0.32° C./W.

An infrared-emitting semiconductor laser element (1 mm×1 mm×0.5 mm) (output density: 5.3 W/cm$^2$) was mounted on the first self-standing diamond film and the desired wiring was formed to prepare a laser element-mounted device. A metal (Au) wiring was formed by a conventional patterning on the diamond surface.

Cooling water (temperature: 25° C.) was supplied in the groove of the laser element-mounted device. The laser element was oscillated. A gradual shift of the generated wave length to the longer wave length was observed.

EXAMPLE 10

Annealing in air

A grooved first self-standing diamond film and a second self-standing diamond film were prepared in the same manner as in Example 7. The first self-standing diamond film was positioned in an atmospheric oven and annealed in air at 600° C. for 30 minutes. Then, the first self-standing diamond film was adhered to the second self-standing diamond film in the same manner as in Example 7 to prepare a diamond substrate.

Cooling water (temperature:25° C.) was supplied in the flow path of the resultant channeled diamond substrate. The thermal resistance between the diamond surface and the cooling medium water was measured to be 0.01° C./W.

A laser element-mounted device was prepared in the same manner as in Example 7. Cooling water (temperature: 25° C.) was supplied in the flow path of the substrate. The laser element was oscillated. A change (particularly, a change of a generated wave length) was not observed for a long time.

EXAMPLE 11

Annealing under vacuum

A grooved first self-standing diamond film and a second self-standing diamond film were prepared in the same manner as in Example 7. The first self-standing diamond film was positioned in a vacuum oven and annealed under vacuum at 1,200° C. for 30 minutes. The Raman spectroscopy of the first self-standing diamond film was measured. As shown in FIG. 8 (b), the peak which shows the non-diamond material was observed. Then, the first self-standing diamond film was adhered to the second self-standing diamond film in the same manner as in Example 7 to prepare a diamond substrate.

Cooling water (temperature:25° C.) was supplied in the flow path of the resultant substrate. The thermal resistance between the diamond surface and the cooling medium water was measured to be 0.01° C./W.

A laser element-mounted device was prepared in the same manner as in Example 7. Cooling water (temperature; 25° C.) was supplied in the flow path of the substrate. The laser element was oscillated. A change (particularly, the change of the generated wave length) was not observed for a long time.

EXAMPLE 12

On a substrate prepared in the same manner as in Example 7, a MPU chip (very large number of circuits are formed on a Si chip) was mounted by a TAB technique with the preparation of a suitable wiring.

While cooling water (temperature: 25° C.) was flown in a flow path prepared in the substrate, the semiconductor device was operated. The device operated for long time without a wrong operation.

EXAMPLE 13

CVD, selective growth, adhesion

On a scratched polycrystal Si base material (10 mm×10 mm ×(thickness) 2 mm), a mask of Ti was formed as in FIG. 3. Diamond was grown by a hot filament assisted CVD method on the base material. The growth conditions included a methane 2%-hydrogen system, a pressure of 80 Torr, a filament temperature of 2,100° C. and a base material temperature of 880° C. After the growth for 650 hours, diamond grown on Si covered the whole main surface of the base material including the Ti mask and the thickness of diamond was 950 μm. A growth surface was polished and the mask and the Si base material were dissolved in an acid to give a grooved self-standing diamond film having a size of 10 mm×10 mm×(thickness) 0.85 mm. The groove had a depth of 80 μm, a width of about 300 μm and a space of about 700 μm. A thermal conductivity was measured to be 14.8 W/cm·K.

The resultant grooved diamond was adhered to a CuW alloy film.

The CuW alloy film provisionally had gates for a cooling medium passing through the groove of diamond.

Cooling water (temperature: 25° C.) was supplied in the groove of the resultant diamond/CuW substrate. A thermal resistance between the diamond surface and cooling water was measured to be 0.018° C./W.

EXAMPLE 14

CVD, selective growth, adhesion

As in Example 13, after a mask of Ti was formed on a scratched polycrystal SiC base material (10 mm×10 mm× (thickness) 4 mm), diamond was grown by a hot filament CVD method on the base material. The polycrystal SiC base material provisionally had gates for introducing a cooling medium at both ends of mask (corresponding to a groove).

Then, only the Ti mask was removed by the dissolution in an acid to give a grooved diamond/SiC substrate. Cooling water (temperature: 25° C.) was supplied in the groove of the resultant diamond/SiC substrate. A thermal resistance between the diamond surface and cooling water was measured to be 0.025° C./W.

EXAMPLE 15

Groove formation from a side surface

On a scratched polycrystal Si base material (4 mm×4 mm×1 mm), diamond was grown by a hot filament CVD method. The growth conditions included a methane 2%-hydrogen system, a pressure of 100 Torr, a filament of tungsten, a filament temperature of 2,100° C. and a base material temperature of 850° C. After the growth of diamond, a growth surface was polished and the Si base material was dissolved in an acid to give a self-standing diamond film having a size of 4 mm×4 mm×(thickness) 0.45 mm. A thermal conductivity was measured to be 15.9 W/cm·K.

A KrF excimer laser was pointedly focused on a side surface of the resultant diamond to form through-holes. The hole had a height of about 250 μm, a width of about 300 μm and a space of about 300 μm.

The flow path was provided with an inlet and outlet for introducing a cooling medium. The cooling medium water (temperature: 25° C.) was supplied into the flow path. A thermal resistance between the diamond surface and cooling water was measured to be 0.012° C./W.

EXAMPLE 16

Etching

Two scratched polycrystal Si base materials (10 mm×10 mm ×thickness 2 mm) were provided. Diamond was grown on the base material by a microwave plasma enhanced CVD method. The growth conditions included a methane 1%-hydrogen system, a pressure of 80 Torr and a base material temperature of 900° C. After the growth for 300 hours in the case of one base material and for 200 hours in the case of the other base material, a growth surface was polished and the Si base material was dissolved in an acid to give two self-standing diamond films, one film (a first self-standing diamond film) having a size of 10 mm×10 mm×(thickness) 0.3 mm and the other film (a second self-standing diamond film) having a size of 10 mm×10 mm ×(thickness) 0.15 mm.

An Al mask pattern having a width of about 100 μm and a space of about 50 μm was formed on one surface of the first self-standing diamond film. The surface of the first self-standing diamond film was plasma etched by the use of a gas mixture of argon and oxygen. The plasma etching was conducted for 3 hours in the condition including an oxygen content of 20%, a total pressure of 0.05 Torr and a RF output power of 200 W. After the plasma etching, the Al mask was removed by the dissolution in an acid to give a grooved first self-standing film having a groove having a depth of about 50 μm, a width of about 50 μm and a space of about 100 μm.

After Ti, Pt and Au were vapor-deposited on both of the diamond films, the first self-standing diamond film was adhered to the second self-standing diamond film by melting an Au layer to give a substrate. The thickness of a Ti/Pt/Au/Pt/Ti layer was 1 μm.

Cooling water (temperature: 25° C.) was supplied in the flow path of the substrate. A thermal resistance between the diamond surface and cooling water was measured to be 0.021° C./W.

EXAMPLE 17

Two scratched polycrystal Si base materials (10 mm×10 mm ×(thickness) 2 mm) were provided. Diamond was grown on the base materials by a microwave plasma enhanced CVD method. One of the Si base materials provisionally had a groove having a depth of about 60 μm, a width of about 100 μm and a space of about 200 μm. The growth conditions included a methane 1%-hydrogen system, a pressure of 80 Torr and a base material temperature of 900° C. After the growth, a growth surface was polished and the Si base materials were dissolved in an acid to give two self-standing diamond films, one film having a size of 10 mm×10 mm×(thickness) 0.3 mm (a first self-standing diamond film) and the other film having a size of 10 mm ×10 mm×(thickness) 0.15 mm (a second self-standing diamond film). Since the first self-standing diamond film was formed on the grooved Si base material, a groove having a depth of about 60 μm, a width of about 200 μm and a space of about 100 μm was formed on the first self-standing diamond film. A thermal conductivity was measured to be 15.9 W/cm·K (for the first self-standing diamond film) and 18.2 W/cm·K (for the second self-standing diamond film).

Two self-standing diamond films were adhered to give a substrate. Cooling water (temperature: 25° C.) was supplied in the flow path of the substrate. A thermal resistance between the diamond surface and cooling water was measured to be 0.017° C./W.

EXAMPLE 18

Two scratched polycrystal Si base materials (10 mm×10 mm ×(thickness) 2 mm) were provided. Diamond was grown on the base materials by a hot filament assisted plasma CVD method. Each of the two Si base materials provisionally had a molybdenum film having a thickness of 2 μm, a width of 100 μm and a space of 20 μm. The growth conditions included a methane 2%-hydrogen system, a pressure of 100 Torr, a filament of tungsten, a filament temperature of 2,100° C. and a base material temperature of 850° C. After the growth, a growth surface was polished and the molybdenum film and the Si base material were dissolved in an acid to give two self-standing diamond films, one film having a size of 10 mm×10 mm×(thickness) 0.3 mm (a first self-standing diamond film) and the other film having a size of 10 mm ×10 mm×(thickness) 0.15 mm (a second self-standing diamond film). A groove having a depth of about 40 μm, a width of about 200 μm and a space of about 100 μm was formed on both of the first and second self-standing diamond films. A thermal conductivity was measured to be 15.2 W/cm·K (for the first self-standing diamond film) and 16.9 W/cm·K (for the second self-standing diamond film).

Two self-standing diamond films were adhered by the use of a Ti/Pt/Au/Pt/Ti layer so that the grooves of both films were matched to give a substrate. Cooling water (temperature: 25° C.) was supplied in the flow path of the substrate. A thermal resistance between the diamond surface and cooling water was measured to be 0.018° C./W.

EXAMPLE 19

One scratched polycrystal Si base material (10 mm×10 mm ×(thickness) 2 mm) was provided. Diamond was grown on the base material by a hot filament assisted CVD method. The growth conditions included a methane 2%-hydrogen system, a pressure of 100 Torr, a filament of tungsten, a filament temperature of 2,100° C. and a base material temperature of 850° C. After the growth, a growth surface was polished and the Si base material was dissolved in an acid to give a self-standing diamond film having a size of 10 mm×10 mm×(thickness) 0.15 mm. After a molybdenum film having a thickness of about 5 μm, a width of about 100 μm and a space of about 200 μm was deposited on the self-standing film, a diamond film was formed in the same manner as in the above. A growth surface was polished and the molybdenum film was dissolved in an acid to give a substrate having a thickness of 450 μm. A flow path in the substrate had a height of about 60 μm, a width of about 200 μm and a space of about 100 μm.

Cooling water (temperature: 25° C.) was supplied in the flow path of the substrate. A thermal resistance between the diamond surface and cooling water was measured to be 0.02° C./W.

EFFECT OF THE INVENTION

The heat-dissipating substrate according to the present invention has a high heat-dissipating property. It has a significant effect, when the substrate has an element having a very large evolved heat amount per a unit area, for example, a laser chip having a high energy density which cannot be successfully dealt with a conventional substrate.

The present invention provides an element-mounted device having a high heat-dissipating property so that an element can stably operate for a long time.

The present invention gives a semiconductor device having an excellent heat-dissipating property and a very large mounting density. The present invention provides a compact and cheap information processing instrument having a high performance.

The method of preparing the substrate according to the present invention can easily give the substrate having the high heat dissipating property.

What is claimed is:

1. A substrate comprising a layer of a high thermal conductivity material having a thermal conductivity of at least 10 W/cm·K and positioned on a base material, wherein a flow path for passing a cooling medium is provided only on the high thermal conductivity material layer adjacent an interface between the base material and the high thermal conductivity material layer.

2. The substrate according to claim 1, wherein the high thermal conductivity material layer is diamond.

3. The substrate according to claim 2, wherein diamond is prepared by a chemical vapor deposition process.

4. The substrate according to claim 1, wherein a depth of the flow path for passing the cooling medium is at least 50 μm and at most 90% of the high thermal conductivity material layer thickness.

5. The substrate according to claim 1, wherein a width of the flow path for passing the cooling medium is from 20 μm to 10 mm.

6. The substrate according to claim 1, wherein a space between the flow paths for passing the cooling medium is from 20 μm to 10 mm.

7. The substrate according to claim 1, wherein a ratio of a width (a) of the flow path to a space (b) between the flow paths is such that $0.02 \leq (a/b) \leq 50$.

8. The substrate according to claim 1, wherein the flow path for passing the cooling medium is positioned radially or spirally from a center part of the substrate toward a circumferential part of the substrate.

9. The substrate according to claim 1, wherein a surface of the flow path for passing the cooling medium is treated so as to increase the wettability of a flow path surface by the cooling medium.

10. A heat-dissipating substrate comprising a layer of a high thermal conductivity material having a thermal conductivity of at least 10 W/cm·K and positioned on a base material, wherein a flow path for passing a cooling medium is provided only on the high thermal conductivity material layer adjacent an interface between the base material and the high thermal conductivity material layer.

11. The substrate according to claim 10, wherein the high thermal conductivity material layer is diamond.

12. The substrate according to claim 11, wherein diamond is prepared by a chemical vapor deposition process.

13. The substrate according to claim 10, wherein a depth of the flow path for passing the cooling medium is at least 50 μm and at most 90% of the high thermal conductivity material layer thickness.

14. The substrate according to claim 10, wherein a width of the flow path for passing the cooling medium is from 20 μm to 10 mm.

15. The substrate according to claim 10, wherein a space between the flow paths for passing the cooling medium is from 20 μm to 10 mm.

16. The substrate according to claim 10, wherein a ratio of a width (a) of the flow path to a space (b) between the flow paths is such that $0.02 \leq (a/b) \leq 50$.

17. The substrate according to claim 10, wherein the flow path for passing the cooling medium is positioned radially or spirally from a center part of the substrate toward a circumferential part of the substrate.

18. The substrate according to claim 10, wherein a surface of the flow path for passing the cooling medium is treated so as to increase the wettability of a flow path surface by the cooling medium.

19. An element-mounted device comprising a layer of a high thermal conductivity material having a thermal conductivity of at least 10 W/cm·K and positioned on a base material wherein a flow path for passing a cooling medium is provided only on the high thermal conductivity material layer adjacent an interface between the base material and the high thermal conductivity material layer, and at least one heating element having a maximum heat density of at least 1 W/cm$^2$ is mounted on the high thermal conductivity material layer.

20. The device according to claim 19, wherein the heating element is a semiconductor element.

21. The device according to claim 20, wherein the semiconductor element is a semiconductor laser.

22. The device according to claim 20, wherein the semiconductor element is a microprocessor.

23. A substrate comprising at least one flow path for passing a cooling medium which is embedded in a plate made of a high thermal conductivity material having a thermal conductivity of at least 10 W/cm·K.

24. The substrate according to claim 23, wherein the high thermal conductivity material layer is diamond.

25. The substrate according to claim 24, wherein diamond is prepared by a chemical vapor deposition process.

26. The substrate according to claim 23, wherein a depth of the flow path for passing the cooling medium is at least 50 μm and at most 90% of the high thermal conductivity material layer thickness.

27. The substrate according to claim 23, wherein a width of the flow path for passing the cooling medium is from 20 μm to 10 mm.

28. The substrate according to claim 23, wherein a space between the flow paths for passing the cooling medium is from 20 μm to 10 mm.

29. The substrate according to claim 23, wherein a ratio of a width (a) of the flow path to a space (b) between the flow paths is such that $0.02 \leq (a/b) \leq 50$.

30. The substrate according to claim 23, wherein the flow path for passing the cooling medium is positioned radially or spirally from a center part of the substrate toward a circumferential part of the substrate.

31. The substrate according to claim 23, wherein a surface of the flow path for passing the cooling medium is treated so as to increase the wettability of a flow path surface by the cooling medium.

32. A heat-dissipating substrate comprising at least one flow path for passing a cooling medium is embedded in a plate made of a high thermal conductivity material having a thermal conductivity of at least 10 W/cm·K.

33. The substrate according to claim 32, wherein the high thermal conductivity material layer is diamond.

34. The substrate according to claim 33, wherein diamond is prepared by a chemical vapor deposition process.

35. The substrate according to claim 32, wherein a depth of the flow path for passing the cooling medium is at least 50 μm and at most 90% of the high thermal conductivity material layer thickness.

36. The substrate according to claim 32, wherein a width of the flow path for passing the cooling medium is from 20 μm to 10 mm.

37. The substrate according to claim 32, wherein a space between the flow paths for passing the cooling medium is from 20 μm to 10 mm.

38. The substrate according to claim 32, wherein a ratio of a width (a) of the flow path to a space (b) between the flow paths is such that $0.02 \leq (a/b) \leq 50$.

39. The substrate according to claim 32, wherein the flow path for passing the cooling medium is positioned radially or spirally from a center part of the substrate toward a circumferential part of the substrate.

40. The substrate according to claim 32, wherein a surface of the flow path for passing the cooling medium is treated so as to increase the wettability of a flow path surface by the cooling medium.

41. An element-mounted device wherein at least one flow path for passing a cooling medium is embedded in a substrate made of a high thermal conductivity material having a thermal conductivity of at least 10 W/cm·K, and at least one heating element having a maximum heat density of at least 1 W/cm$^2$ is mounted on the substrate.

42. A semiconductor device having at least two piled substrates, wherein at least one flow path is embedded in each substrate made of a high thermal conductivity material having a thermal conductivity of at least 10 W/cm·K, at least one element is mounted on each substrate, and a metal wiring for connecting between the elements is positioned on or in the substrate.

43. A method of preparing a substrate which comprises steps of
   a) conducting a laser light treatment on one main surface of a plate comprising a high thermal conductivity material having a thermal conductivity of at least 10 W/cm·K to form a flow path for passing a cooling medium on said surface, and
   b) adhering said treated surface to a base material.

44. The method according to claim 43, wherein the laser light is an excimer laser light.

45. The method according to claim 43, wherein the high thermal conductivity material is diamond.

46. The method according to claim 45, wherein diamond is prepared by a chemical vapor deposition process.

47. The method according to claim 43, which further comprises step of treating a surface of the flow path for passing the cooling medium so as to increase the wettability by the cooling medium.

48. A method of preparing a substrate which comprises steps of
   a) conducting a laser light treatment on one main surface of a plate comprising a high thermal conductivity material having a thermal conductivity of at least 10 W/cm·K to form a flow path for passing a cooling medium on said surface, and
   b) adhering said treated surface to another plate comprising a high thermal conductivity material having a thermal conductivity of at least 10 W/cm·K.

49. A method of preparing a substrate which comprises a step of conducting a laser light treatment on a side surface of a plate comprising a high thermal conductivity material having a thermal conductivity of at least 10 W/cm·K to form a flow path for passing a cooling medium.

50. A method of preparing a substrate which comprises steps of
   a) providing a mask partially on one main surface of a plate comprising a high thermal conductivity material having a thermal conductivity of at least 10 W/cm·K,
   b) selectively etching a portion having no mask to form a flow path for passing a cooling medium,
   c) removing the mask, and
   d) adhering the etched surface to a base material.

51. The method according to claim 50, wherein the base material is a plate comprising a high thermal conductivity material having a thermal conductivity of at least 10 W/cm·K.

52. The method according to claim 50, wherein the step of selectively etching the portion having no mask is conducted by a plasma of oxygen or a reactive gas containing oxygen.

53. A method of preparing a substrate which comprises steps of
   a) forming a groove on a plate material,
   b) growing diamond by a chemical vapor deposition on the plate material,
   c) removing the plate material to give a grooved self-standing diamond film, and
   d) adhering the grooved surface of the diamond film to a base material.

54. The method according to claim 53, wherein the base material is a self-standing diamond film.

55. A method of preparing a substrate which comprises steps of
   a) providing a mask on a base material,
   b) growing diamond by a chemical vapor deposition on the base material, and
   c) removing the mask to give a flow path for passing a cooling medium.

56. A method of preparing a substrate which comprises steps of
   a) providing a mask on a plate material,
   b) growing diamond by a chemical vapor deposition on the plate material,
   c) removing the mask and the plate material to give a grooved self-standing diamond film, and
   d) adhering the grooved surface of the diamond film to a base material.

* * * * *